United States Patent
McLeod

(10) Patent No.: US 8,107,636 B2
(45) Date of Patent: Jan. 31, 2012

(54) INDIVIDUAL AUDIO RECEIVER PROGRAMMER

(75) Inventor: Malcolm N. McLeod, Chapel Hill, NC (US)

(73) Assignee: McLeod Discoveries, LLC, Blowing Rock, NC (US)

( * ) Notice: Subject to any disclaimer, the term of this patent is extended or adjusted under 35 U.S.C. 154(b) by 283 days.

(21) Appl. No.: 12/508,985

(22) Filed: Jul. 24, 2009

(65) Prior Publication Data

US 2010/0020988 A1 Jan. 28, 2010

Related U.S. Application Data

(60) Provisional application No. 61/083,370, filed on Jul. 24, 2008.

(51) Int. Cl.
*H04R 29/00* (2006.01)
*H04R 25/00* (2006.01)
(52) U.S. Cl. .......................................... 381/60; 381/314
(58) Field of Classification Search .................. 381/312, 381/314, 321, 60, 107, 23.1; 600/559
See application file for complete search history.

(56) References Cited

U.S. PATENT DOCUMENTS

| 7,490,044 | B2 | 2/2009 | Kulkarni | |
| 7,564,979 | B2 * | 7/2009 | Swartz | 381/60 |
| 2004/0204921 | A1 * | 10/2004 | Bye et al. | 702/189 |

OTHER PUBLICATIONS

B. Joseph Pine, "Mass Customization: the new frontier in business competition.," Harvard Business School Press (1993).
James H. Gilmore and B. Joseph Pine, "The Four Faces of Mass Customization," Harvard Business Review (Jan./Feb. 1997).

* cited by examiner

*Primary Examiner* — Curtis Kuntz
*Assistant Examiner* — Sunita Joshi
(74) *Attorney, Agent, or Firm* — Jenkins, Wilson, Taylor & Hunt, P.A.

(57) ABSTRACT

Methods and devices to compensate for individual hearing loss when listening to audio systems are described. An individualized frequency configuration is applied to the output of an audio system wherein the volume of audio signals at one or more frequencies is adjusted to compensate for a user's hearing deficit. The devices are operable to work with multiple users.

14 Claims, 3 Drawing Sheets

300

400

INDIVIDUAL AUDIO RECEIVER PROGRAMMER

RELATED APPLICATIONS

The presently disclosed subject matter claims the benefit of U.S. Provisional Patent Application Ser. No. 61/083,370, filed Jul. 24, 2008; the disclosure of which is incorporated herein by reference in its entirety.

TECHNICAL FIELD

The present subject matter is related to methods and devices to compensate for individual hearing loss and more particularly to improved methods and apparatus for listening to audio systems by adjustment of particular sound frequencies for the individual.

BACKGROUND

Hearing loss is a prevalent disorder that impairs enjoyment, learning and social interactions for millions of people. Loss of high frequency hearing begins in the 20s. This includes the most common type of hearing deficit, known as presbycusis, or age-related hearing loss. Presbycusis can be defined as progressive bilateral symmetrical age-related sensorineural hearing loss. Literally the word means "old man hearing" [*G. presbys*, old man; *G. akousis* hearing], but this is a misnomer as loss of hearing of high frequencies begins in the 20s. For example, the 18 kHz "mosquito" tone—used to alert adolescents that a cell phone message has arrived—cannot be heard by many people in their 20s.

Presbycusis is also known as sensorineural hearing loss and "nerve deafness." It is identified by the sky-slope audiogram curve, which indicates that the higher the frequencies, the greater the loss. Both ears tend to be affected. Over time, the detection of high-pitched sounds becomes more difficult and speech perception is affected.

Presbycusis is the most frequent type of hearing loss, accounting for 90% of cases. Approximately 25% of people in the 65 and older age group are afflicted with presbycusis.

The main causes of presbycusis are advancing age and exposure to loud noise. The prevalence of this hearing disorder is certain to increase significantly in the United States as Baby Boomers grow older, and a history of the damaging effects of exposure to loud noise (e.g. rock concerts) take their toll.

When listening to audio systems, such as a television, home entertainment system, or telephone, those with hearing loss find they need to adjust the output sound volume of certain frequencies in order to sufficiently hear the sounds at the frequencies for which they are hearing impaired, for example, high-pitched tones. Otherwise, the hearing impaired listener may "miss" some words and tones, especially the high notes. This loss interferes with communication and enjoyment of music and other sounds.

Individuals suffering from hearing loss might attempt to compensate for their hearing deficits by turning up the volume on the television, for instance. The problem with simply turning up the volume is that most listening devices amplify all frequencies. People with presbycusis do not need louder low notes, as their hearing of low notes is not impaired. Rather they need graded amplification of high notes at various frequencies. For those with presbycusis, when the volume is turned up enough to hear the high notes, such as the chirping of a bird, the bass notes are so loud they sound like a freight train passing close by. Televisions, home theatres, and other audio systems are not tailor-made to compensate for the individual's hearing deficits. To correct this problem, the sound volume of various frequencies needs to be differentially adjusted.

There are some products on the market which allow crude attempts to adjust for various frequencies. For example, some speakers have two controls, one for adjusting bass and the other for adjusting treble. This approach is far too broad to significantly improve sound for those with hearing loss.

Other available products include receivers with pre-programmed settings that attempt to offer the listener a more pleasing sound, for example "Acoustic," "Classical," "Cinema," "Jazz," "Bass Booster," "Piano," "Spoken Word," or "Opera." The operative and limiting word here is "pre-programmed." In other words the pre-programmed settings are not custom-adjusted for an individual listener based on the results of a hearing loss analysis, such as an audiogram. Hearing impaired users are not satisfied with these settings.

In accordance with the presently disclosed subject matter, provided herein are methods and devices that allow an individual to program audio receivers to compensate for his or her specific, individual hearing deficits.

SUMMARY

In some embodiments of the presently disclosed subject matter, a method of customizing an audio system to compensate for hearing loss for a hearing-impaired user comprises providing a hearing analysis for the hearing-impaired user, applying an individualized frequency configuration to an audio output of the system, and outputting adjusted sound signals. The frequency configuration is used by a processor of an audio adjusting device to adjust the volume of audio signals at one or more frequencies where the user has a hearing deficit as determined by the hearing analysis.

In some embodiments, the method of customizing an audio system further comprises first identifying the frequencies at which the user has hearing loss. This can be done by testing the user's response to tones of various frequencies and generating an audiogram based on user's responses. The testing can comprise providing an audio tone at a particular frequency and soliciting user's response. If the user does not respond then the tone is amplified at the same frequency until the user responds. The process can be repeated at a range of frequencies.

In some embodiments, a sound adjusting device for customizing an audio output comprises a receiver for receiving individualized frequency configuration input, and a processor operable to apply the frequency configuration to signals of the audio output. In some embodiments the frequency configuration input can comprise one or more corrective frequency settings for sound frequencies at which the hearing-impaired user has hearing loss.

In some embodiments, the sound adjusting device further comprises a speaker operable to play the audio signals generated from the processor to the hearing-impaired user. In some embodiments, the sound adjusting device further comprises a memory component for storing individualized frequency configurations for one or more users;

In some embodiments, the sound adjusting device further comprises a hearing analysis component capable of generating the individualized frequency configuration for the hearing-impaired user. The frequency configuration can be generated by testing the user's response to tones of various frequencies and generating an audiogram based on user's responses. The testing can comprise providing a series of audio tones at a particular frequency and soliciting the user's response. If the user does not respond then the tone is amplified at the same frequency until the user responds.

In some embodiments, the sound adjusting device comprises a processor capable of applying a frequency configuration at a frequency averaged among two or more users.

In some embodiments, the sound adjusting device is operable to emit adjusted signals from two or more frequency configurations through different output ports.

In some embodiments, the presently claimed subject matter includes a sound emitting system comprising the sound adjusting device described above.

It is an object of the presently disclosed subject matter to provide better listening experience for the hearing impaired user of audio systems.

An object of the presently disclosed subject matter having been stated hereinabove, and which is achieved in whole or in part by the presently disclosed subject matter, other objects will become evident as the description proceeds when taken in connection with the accompanying drawings as best described hereinbelow.

DETAILED DESCRIPTION

Figure 1:
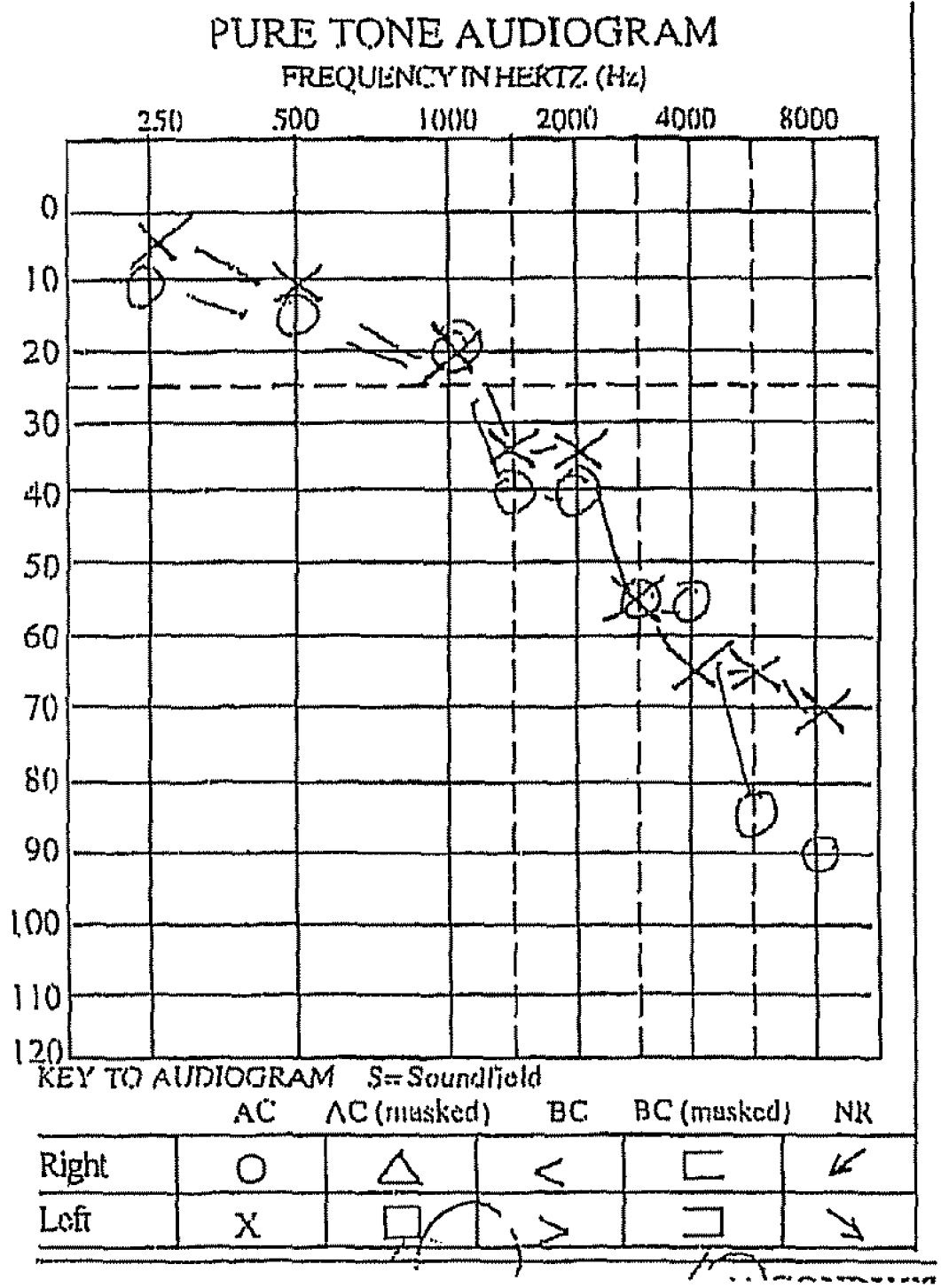
FIG. 1 is an audiogram of a hearing impaired user. Frequency, on the X-axis is plotted against decibels hearing level, on the Y-axis.

A hearing-impaired user of audio systems can make a "stab in the dark" effort to correct the above problem by increasing the decibel level ("volume") of sound at various frequencies. A typical stereo receiver or other audio system might have a graphic equalizer comprising a bank of sliders for increasing and decreasing different bands (frequencies ranges) of sound. The user can increase or decrease the volume of signal at a selected frequency. The volume sliders can be used to make any combination of frequency configurations.

For example, a hearing-impaired user might customize a receiver by using the "Manual EQ Setup" function on the audio system. This function can be called by a different term depending on the type of audio system. Thus the term "Manual EQ Setup" is used herein for convenience and is not meant to be a limitation. One such system displays a screen titled, "Manual EQ Setup for Front Left Speaker." A schematic of that screen is shown below in Table 1.

TABLE 1

| Manual EQ Setup >Front L< | |
| --- | --- |
| 63 Hz | 0.0 dB |
| 125 Hz | 0.0 dB |
| 250 Hz | 0.0 dB |
| 500 Hz | 0.0 dB |
| 1 kHz | 0.0 dB |
| 2 kHz | 0.0 dB |
| 4 kHz | 0.0 dB |
| 8 kHz | 0.0 dB |

In this example, the receiver allows manual adjustment of decibel levels for 8 frequencies. The settings for each frequency band can be selected, one at a time, and toggled right and left, thereby increasing or decreasing the volume (dB) for that frequency. A typical system might allow adjustment within a range from −6.0 dB to +6.0 dB in 0.5 dB increments, as shown in Table 2 below. That is a total of 25 possible adjustments for each of the 8 frequency settings, with zero included as a step. This is a "hit or miss" endeavor if the magnitude of the individual's hearing loss at specific frequencies is not known.

TABLE 2

| Manual EQ Setup >Front L< | |
| --- | --- |
| 63 Hz | −6.0 dB to +6.0 dB |
| 125 Hz | −6.0 dB to +6.0 dB |
| 250 Hz | −6.0 dB to +6.0 dB |
| 500 Hz | −6.0 dB to +6.0 dB |
| 1 kHz | −6.0 dB to +6.0 dB |
| 2 kHz | −6.0 dB to +6.0 dB |
| 4 kHz | −6.0 dB to +6.0 dB |
| 8 kHz | −6.0 dB to +6.0 dB |

After randomly adjusting the decibel levels of the frequencies depicted in Table 2, the quality of sound will often deteriorate, as perceived by the user. Successfully programming a receiver to compensate for hearing loss by the random adjustment of frequencies, without knowing the magnitude of the user's hearing loss and at what frequencies, is highly improbable. It is akin to picking a pair of glasses off the shelf at a mass retail store without knowing in advance the degree of visual impairment. The chances of randomly picking the 'right' pair of glasses is, in fact, far more probable than randomly correcting for audio frequencies. The receiver represented in Table 2 has the capability to adjust eight frequency settings over a range from −6.0 dB to +6.0 dB in 0.5 db increments. The chance of finding a frequency augmentation that compensates for an individual user's hearing loss by fiddling with the decibel level controls is 1 in $25^8$ or over 152 billion.

According to probability theory, it is practically impossible to adjust a receiver to correct for a user's hearing loss by chance, that is, without knowing approximately the hearing deficits at various frequencies. What is needed is a device that can accommodate input of a pre-determined degree of hearing loss and that can provide the volume (dB) augmentation necessary for correction at any number of desired frequencies, such as eight, or even more.

The presently disclosed subject matter pertains in some embodiments to methods and devices (see e.g. device 200 in FIG. 2) for the automatic adjustment of sound based on an audiogram or hearing analysis. In some embodiments a sound adjusting device is built into a standard stereo receiver, a television, telephone, or any audio system so that sound emitted therefrom is automatically adjusted to reflect the hearing status of the current user. Particularly, the adjustment can be based on an audiogram analysis of the user (see e.g. audiogram analysis 270 in FIG. 2).

Referring now to FIG. 1, in an audiogram, a person's hearing loss is represented by a plot of the threshold of hearing relative to a standardized curve that represents 'normal' hearing, in decibels (dB). A decibel is a logarithmic unit used to measure the relative magnitude difference in power of an acoustic signal relative to a reference level. It is equal to ten times the logarithm of the ratio of the two levels. An increase from 10 dB to 20 dB is experienced (heard) as twice as loud. Similarly, 50 dB is experienced as twice as loud as 40 dB.

Continuing with FIG. 1, in an audiogram, frequency in hertz (Hz) is usually plotted on the horizontal axis, usually on a logarithmic scale, against decibels hearing level (dBHL) on the vertical axis, on a linear scale. The audiogram in FIG. 1 shows that the subject measured has a hearing loss of 40 decibels at frequencies of 2000 Hz and of 90 decibels at frequencies of 8000 Hz. At 250 Hz, the subject's hearing is nearly normal.

The first step in generating an audiogram is to determine what frequencies of the user are impaired. This is accomplished by recording a user's response to tones played at different frequencies and volumes. As a response, the user, for example, may press a series of buttons to indicate when (at what "volume") the user hears certain frequencies. An audiogram can be obtained from a hearing lab technician or generated by the user on a stand-alone or built-in component of an audio system.

Figure 2:
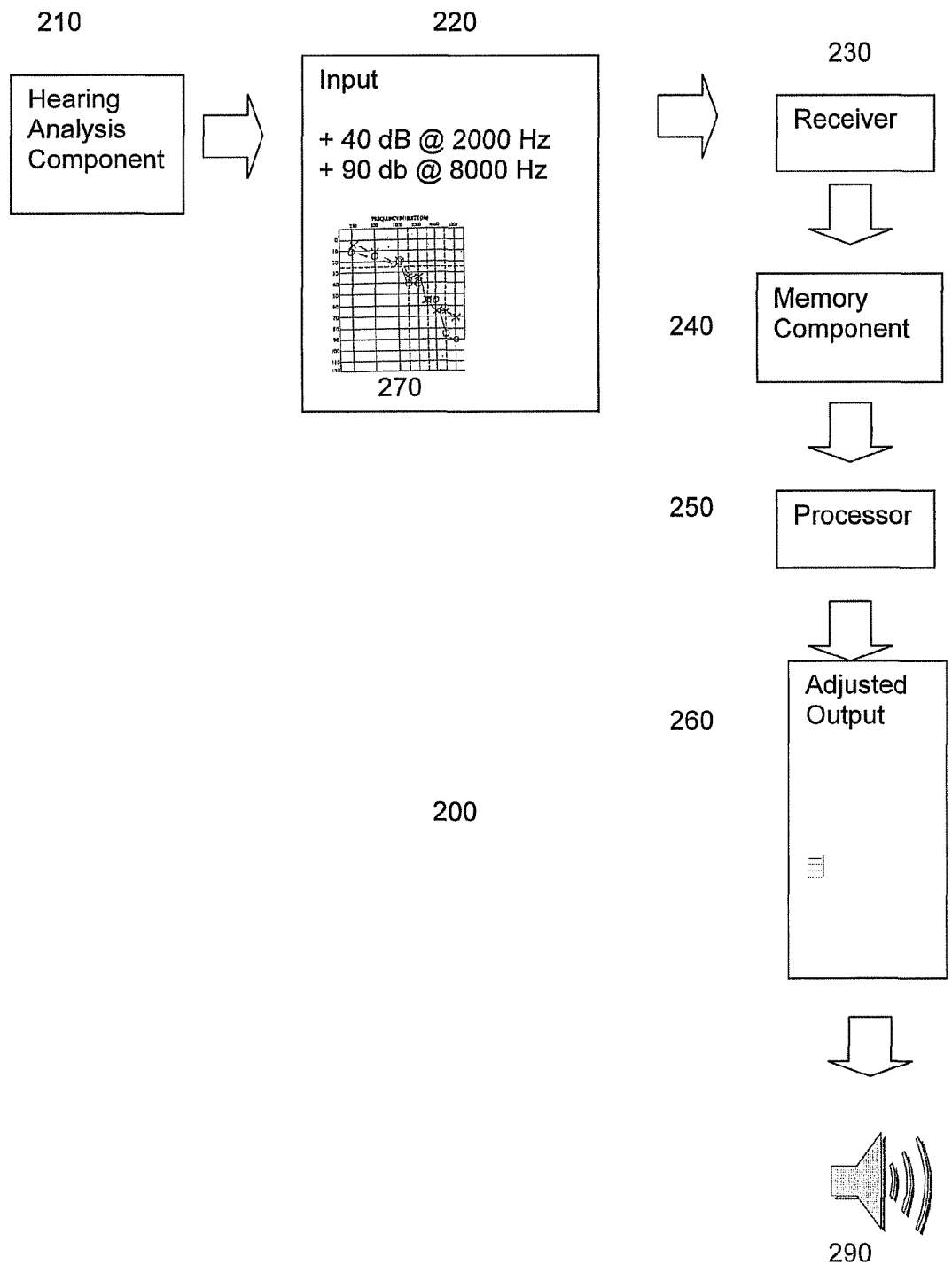
FIG. 2 is a schematic diagram of a sound adjusting device as described herein, and operations thereof.

Referring now to FIG. 2, the presently disclosed subject matter pertains in some embodiments to a device 200 for the automatic adjustment of sound based on an audiogram analysis 270. Sound adjusting device 200 for customizing an audio output 260 can comprise a receiver 230 for receiving individualized frequency configuration input 220, a memory component 240 for storing individualized frequency configurations for one or more users; and a processor 250 operable to apply the frequency configuration to signals of the audio output 260. The frequency configuration input 220 can comprise corrective volume settings for sound frequencies at which the hearing-impaired user has hearing loss. Corrective volume settings thus refer to a change in decibel level from that of a non-hearing impaired or "normal" user. Sound adjusting device 200 can comprise one or more speaker(s) 290 operable to play the audio signals generated from processor 250 to the hearing-impaired user. Speaker(s) 290 can be surround sound speakers.

In some embodiments sound adjusting device 200 is built into a standard stereo receiver, a television, telephone, or other audio system, so that sound output 260 emitted therefrom can be automatically adjusted to reflect the hearing status of the current user. Particularly, the adjustment can be based on an audiogram analysis 270 of the user.

Continuing with FIG. 2, once frequency loss has been determined, the information is entered as input 220 into a receiver 230. Receiver 230 of a sound adjusting device 200 of the presently disclosed subject matter is programmed to automatically, based on an audiogram 270, adjust the decibel levels at various frequencies to compensate for an individual's hearing loss. The adjustment can also be performed manually by the user.

Continuing with FIG. 2, the settings of receiver 230 can be manually adjusted, based on the user's audiogram 270. For example, some stereo receivers allow the user to change the output volume of one or more frequencies. A user with the impairment depicted in FIG. 1 could increase the decibel level to 40 for the 2000 hertz frequency and thereby restore hearing to "normal" for that frequency. That is, signals at 2000 Hz are amplified and heard at the same "level" as signals at 250 Hz for the hearing-impaired user. By the same method, the decibel level can be increased to 90 for the 8000 Hz frequency, thereby rendering hearing as "normal" for this frequency. Thus, the user can hear the one or more frequencies at a consistent volume.

The frequency configurations are desirably adjusted back to normal when a person with normal hearing uses the device. Therefore, sound adjusting device 200 can have a "save" function that allows saving an individual user's input 220 and facilitates switching ideal settings (user profiles) from one user to another. In some embodiments sound adjusting device 200 comprises a memory component 240 capable of storing one or more audiograms 270 as inputs 220. Audiograms 270 can be stored such that they are correlated with individual user(s). As two non-limiting examples an audiogram 270 is entered into the device manually or is saved in the memory 240 during a hearing analysis.

The presently disclosed subject matter addresses a problem in which a listener does not know what his or her hearing loss might be over a given range of frequencies that are typically emitted from a stereo, television, telephone, or other audio system. A representative range of such frequencies can fall from 40 Hz to 8,000 Hz.

Continuing with FIG. 2, in some embodiments, sound adjusting device 200 comprises a hearing analysis component 210. The user's hearing deficit at a particular frequency is determined by the user operating a control to play an audio tone of a particular frequency and adjusting the volume of that tone frequency until the tone is heard by the user. The listener responds, such as by pushing a button. The process can be repeated at other frequencies. The user's response input(s) 220 are used to establish an audiogram analysis 270 and the corrective adjustments for a plurality of frequencies are recorded in a memory component 240.

Continuing with FIG. 2, after entering audiogram analysis 270 into receiver 230 and adjusting the frequencies so that sound is approximately normal, the listener could re-run the audiogram function to see if the desired correction has been made, in which case the abscissa (horizontal line on audiogram) 280 would approach flatness.

The audiogram analysis can be used to provide for the automatic adjustment of sound emitted from an audio system. Thus, in some embodiments, the presently disclosed sound adjusting device can aid the user in establishing an audiogram analysis for use in an automatic adjustment of sound (for example sound frequencies).

In some embodiments, a device in accordance with the presently disclosed subject matter comprises a computing device having computer readable instructions loaded therein which provide for the establishment of an audiogram analysis and/or for the automatic adjustment of sound (for example sound frequency) based on an audiogram analysis. Referring again to FIG. 2, such a computing device can be provided in hearing analysis component 210 and/or in receiver 230.

In some embodiments the audiogram is generated on a stand-alone device. In other embodiments the hearing analysis component is built in to the audio device. Whether separate or integrated, the sound adjusting device in some embodiment operates via an integrated circuit, based upon the audiogram results to automatically adjust the receiver decibel level for various frequencies so that the hearing-impaired person hears all frequencies at a "normal," level. Referring again to FIG. 2, such an integrated circuit can be provided in hearing analysis component 210 and/or in receiver 230.

Because an audiogram reveals the magnitude of hearing loss at various frequencies, the "hit and miss" approach to adjustment advances to a scientific, measurable, and predictable method.

Other products to which the presently disclosed subject matter could be applied include but are not limited to a computer, MP3 player, iPod, or indeed any system in which sound is emitted and in which a user wishes to optimize the sound (for example sound frequencies) based on the user's own hearing so as to facilitate enjoyment of the sound emitting system.

An entry-level receiver that is able to measure 8 (or fewer) hearing frequencies that can be adjusted manually or automatically with a corresponding equalizer. High-end products can be taken to an audio/visual boutique where the audio technician can measure dozens of frequencies and make precise modifications to a sound signal in accordance with an audiogram provided by using a parametric equalizer. The parametric equalizer can raise or lower a range of frequencies around a central frequency in a bell-shaped curve and more accurately hone in and correct hearing deficits. It can adjust for gain and can narrow or widen bandwidth.

Figure 3:
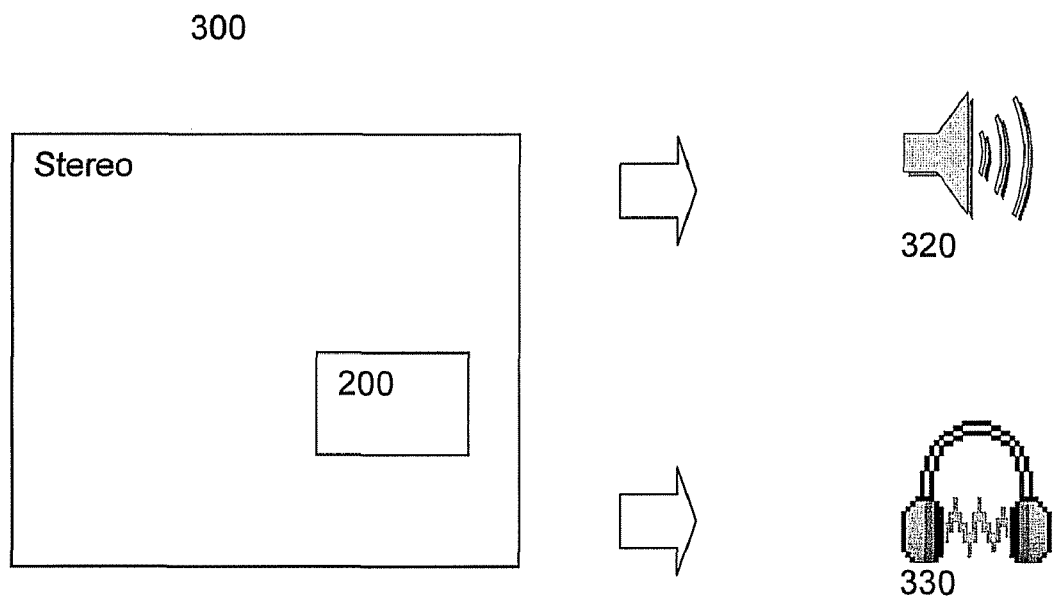
FIG. 3 is a schematic diagram of an embodiment of a sound adjusting device as described herein.
Figure 4:
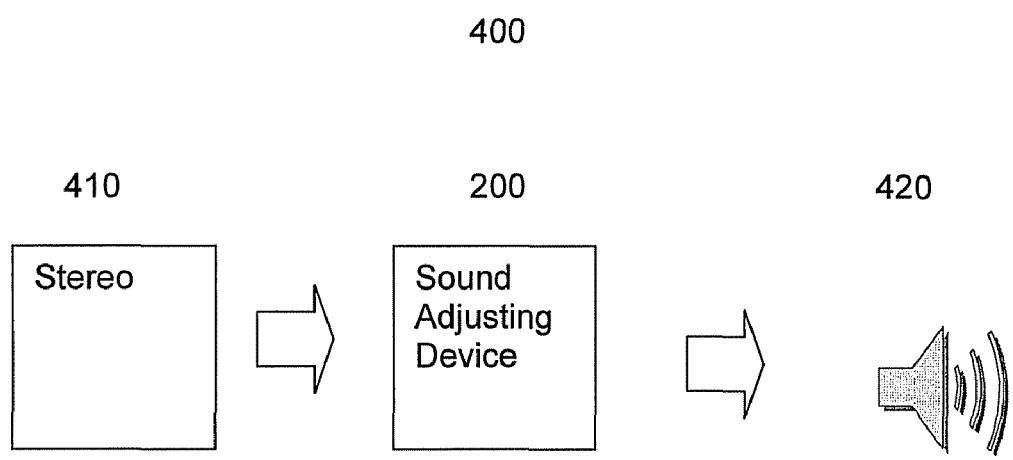
FIG. 4 is schematic diagram of an embodiment of a sound adjusting device as described herein.

Referring again to the Figures, and particularly to FIGS. 3 and 4, in some embodiments, the presently disclosed subject matter comprises a sound emitting system 300 comprising an embodiment of the sound adjusting device 200 described herein. Sound adjusting device 200 can be built in to another component of the system 300 as shown in FIG. 3. In FIG. 3, stereo 310 comprises sound adjusting device 200, and stereo 310 is operably connected to speaker(s) 320 and/or to one or more sets of headphones 330. Speaker(s) 320 can be surround sound speakers. Sound adjusting device 200 can be a stand alone unit as in system 400 of FIG. 4. In FIG. 4, sound adjusting device 200 is operably connected between stereo 410 and speaker(s) 420. Speaker(s) 420 can be surround sound speakers.

In some embodiments, the sound adjusting device described herein is installed in some seats in auditoria, lecture halls, theatres, and airplanes to serve the hearing-impaired. In this embodiment, individuals "plug in" their headphones and adjust frequency/decibel levels. This could have immense value in enabling hearing-impaired individuals to gain more education and pleasure from attending lectures, concerts and travel. The presently disclosed subject matter can be particularly useful in tradeshows, and other industry presentations.

The presently disclosed subject matter can also accommodate multiple listeners. When two or more people are listening, the frequency configuration that sounds good to a hearing-impaired user might sound unpleasantly shrill, metallic, and loud, even similar to the sound of crunching tin foil, to a listener with normal hearing. This problem can be solved in any of several representative ways. Depending on the degree of hearing loss, a sound configuration which is an average of the ideal frequency settings of the listeners can be an acceptable compromise to the multiple users who are listening. In some embodiments, the sound adjusting device is capable of outputting an audio signal at a frequency averaged among two or more users.

Another solution to the multiple user problem is allow the use of headphones for one or more of the users. Referring again to FIGS. 2 and 4, a separate signal 260 is output to each set of headphones 330. By using an independent amplifier embodied in stereo 310, one user's settings can be directed to the output to the headphones 330 and another user can listen to speakers 320 or a second set of headphones 330 adjusted to his or her preferences. The presently disclosed subject matter thus provides embodiments wherein two or more frequency configurations of sound are emitted from the same device through different outputs.

It will be understood that various details of the presently disclosed subject matter may be changed without departing from the scope of the subject matter disclosed herein. Furthermore, the foregoing description is for the purpose of illustration only, and not for the purpose of limitation.

What is claimed is:

1. A method of customizing an audio system to compensate for hearing for two or more users, comprising:
    (a) providing a hearing analysis for two or more users;
    (b) applying an individualized frequency configuration to an audio output of the system wherein a processor of an audio adjusting device uses the frequency configuration to adjust the volume of audio signals at one or more frequencies based on the hearing analysis; and
    (c) outputting sound signals at the adjusted volumes,
    wherein the frequency configuration is at a frequency average among two or more users or wherein two or more frequency configurations are independently applied in outputting sound signals.

2. The method of claim 1, wherein providing a hearing analysis for two or more users comprises testing the user's response to tones of various frequencies and generating an audiogram based on user's responses.

3. The method of claim 2, wherein the testing comprises providing an audio tone at a particular frequency and soliciting user's response, wherein if user does not respond then the tone is amplified at the same frequency until the user responds, and repeating the process at a range of frequencies.

4. A sound adjusting device for customizing an audio output comprising:
    (a) a receiver for receiving individualized frequency configuration input from a user, wherein the input comprises corrective volume settings for sound frequencies for the user; and
    (b) a processor operable to apply the frequency configuration to signals of an audio output,
    wherein the processor is capable of applying a frequency configuration at a frequency averaged among two or more users.

5. The sound adjusting device of claim 4, further comprising a speaker operable to play the signals generated from the processor.

6. The sound adjusting device of claim 4, further comprising a memory component for storing individualized frequency configurations for one or more users.

7. The device of claim 4, further comprising a hearing analysis component operable to generate the individualized frequency configuration.

8. The device of claim 7, wherein the frequency configuration is generated by testing the user's response to tones of various frequencies and generating an audiogram based on user's responses.

9. The device of claim 8, wherein the testing comprises providing an audio tone at a particular frequency and soliciting user's response, wherein if user does not respond then the tone is amplified at the same frequency until the user responds, repeating the process at a range of frequencies.

10. A sound adjusting device for customizing an audio output comprising:
    (a) a receiver for receiving individualized frequency configuration input from a user, wherein the input comprises corrective volume settings for sound frequencies for the user; and
    (b) a processor operable to apply the frequency configuration to signals of an audio output,
    wherein the processor is capable of independently applying two or more frequency configurations and wherein adjusted signals can be emitted from the device through different output ports.

11. A sound emitting system comprising the sound adjusting device of claim 4.

12. The method of claim 1, wherein the frequency configuration is applied using a parametric equalizer.

13. The device of claim 4, wherein the processor comprises a parametric equalizer.

14. The device of claim 10, wherein the processor comprises a parametric equalizer.

* * * * *